United States Patent [19]

Kapral et al.

[11] 4,157,589
[45] Jun. 5, 1979

[54] ARITHMETIC LOGIC APPARATUS

[75] Inventors: Christopher W. Kapral, Burlington; Norman E. Heckman, Concord, both of Mass.

[73] Assignee: GTE Laboratories Incorporated, Waltham, Mass.

[21] Appl. No.: 831,737

[22] Filed: Sep. 9, 1977

[51] Int. Cl.$^2$ .................. H03K 19/20; G06F 7/50
[52] U.S. Cl. ........................... 364/716; 307/207
[58] Field of Search .................. 364/716; 307/207

[56] References Cited

U.S. PATENT DOCUMENTS

| | | | |
|---|---|---|---|
| 3,317,721 | 5/1967 | Berlind | 364/716 |
| 3,584,207 | 6/1971 | Avsan et al. | 364/716 |
| 3,767,906 | 10/1973 | Pryor | 364/716 |

*Primary Examiner*—Jerry Smith
*Attorney, Agent, or Firm*—Fred Fisher

[57] ABSTRACT

A system includes arithmetic logic units, each including two 2:1 multiplexers, one 8:1 multiplexer, and a three input majority gate. Each 2:1 multiplexer provides a specific one of two data inputs when a select input signal is at a specific one of two binary states. The 8:1 multiplexer provides output signals indicative of specific ones of eight data inputs in accordance with the binary states of three select input signals. Electrical signals indicative of two input variables are coupled, respectively, to the select input of the two 2:1 multiplexers. Two outputs therefrom are coupled to two of three select inputs of the 8:1 multiplexer, and to two inputs of the majority gate.

A carry-in signal is coupled to both the third select input of the 8:1 multiplexer, and to the third input of the majority gate. The arithmetic logic unit acts as an adder, subtractor, AND gate, OR circuit, exclusive OR circuit, and NOR circuit.

Arithmetic and logical functions on two input binary variables of the form $A_0, A_1...A_n$ and $B_0, B_1...B_n$ are performed by an arithmetic logic system comprising $n+1$ arithmetic logic units. The output of the majority gate of one logic unit is coupled to the carry-in signal receiving means for following logic unit. With appropriate control signals, the system acts as an adder by providing a sum function at the respective outputs of the 8:1 multiplexer, and provides a carry-out function at the output of the $(n+1)$st logic unit majority gate.

10 Claims, 7 Drawing Figures

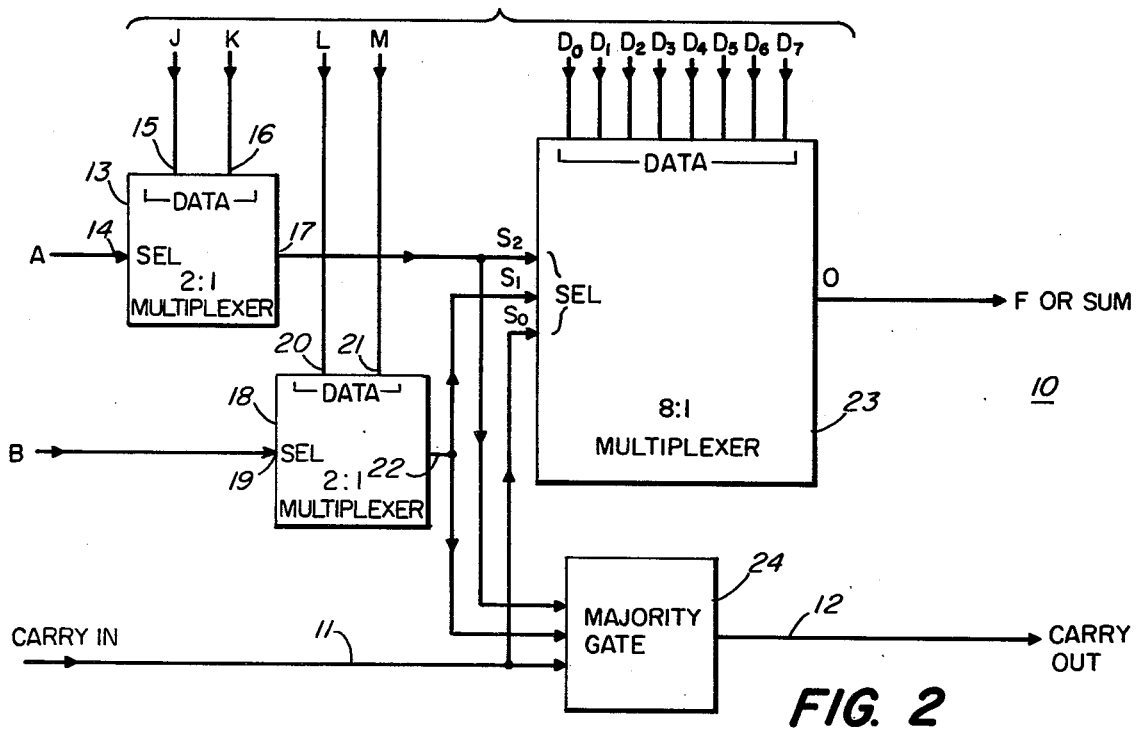
FIG. 2
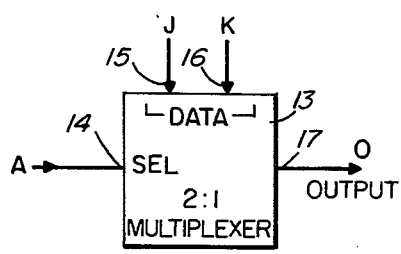
FIG. 3A
| J | K | O |
|---|---|---|
| 0 | 0 | 0 |
| 0 | 1 | A |
| 1 | 0 | $\bar{A}$ |
| 1 | 1 | 1 |
FIG. 3B
FIG. 4
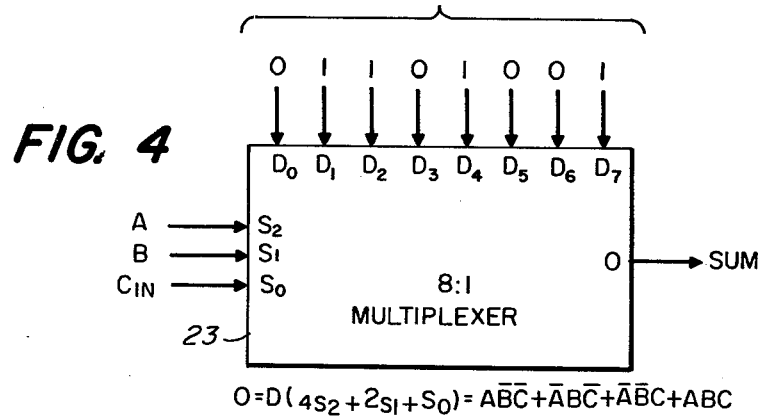
$O = D(4S_2 + 2S_1 + S_0) = A\bar{B}\bar{C} + \bar{A}B\bar{C} + \bar{A}\bar{B}C + ABC$

ARITHMETIC LOGIC APPARATUS

BACKGROUND OF THE INVENTION

1. Field of the Invention

This invention relates to arithmetic logic apparatus and, in particular, to arithmetic logic units which can perform numerous arithmetic and logical functions. Accordingly, it is a general object of this invention to provide new and improved apparatus of such character.

2. Description of the Prior Art

Arithmetic logic units of the prior art, capable of providing logic functions by applying control information to such units, usually are implemented with OR circuits and AND gates, or NOR circuits and NAND gates. Some employ an adder with carry look ahead capability. Typically, such prior art units were bulky, used substantial electric power, and were inefficient.

SUMMARY OF THE INVENTION

It is another object of this invention is to provide a new and improved arithmetic logic unit which is efficient, uses less power, and is less bulky than arithmetic logic units of the prior art.

Still another object of this invention is to provide a new and improved arithmetic logic unit which is suitable for taking utmost advantage of the logical power of multilevel emitter controlled logic structures.

Yet another object of this invention is to provide a new and improved arithmetic logic unit which utilizes less power and area than conventional designs.

Still, yet, another object of the invention is to provide a new and improved arithmetic logic unit in which the logical functions performed can be easily varied by changing the information applied to the control lines of such unit.

In accordance with one embodiment of the invention, an arithmetic logic unit for performing arithmetic and logical functions on two input binary variables A and B and a carry-in signal $C_{IN}$ can include various elements. One element, a 2:1 multiplexer, provides an output signal indicative of a first of two data inputs when a select input is at one of two binary states, and provides an output signal indicative of a second of two data inputs when the select input is at the other of two binary states. Another element includes a second 2:1 multiplexer having similar capabilities. Also provided is an 8:1 multiplexer which provides a first output signal indicative of a first of eight data inputs applied thereto when three select input signals are at one, one, and one of two binary states, respectively. The 8:1 multiplexer provides: a second output signal indicative of a second of the eight data inputs when the three select input signals are said one, said one, and the other of the two binary states, respectively; a third output signal indicative of a third of the eight data inputs when the three select inputs are at said one, the other, and said one of said two binary states, respectively; and, in similar fashion, an eighth output signal indicative of an eighth of the eight data inputs when the three select inputs are at the other, said other, and said other of the two binary states, respectively. A three-input majority gate provides a first output signal when signals of one binary state are applied to none or only one of the three inputs, and provides a second output signal when signals of such one binary state are applied to two or three of its three inputs. The input variable A is coupled to the select input of the first 2:1 multiplexer; the input variable B is coupled to the select input of the second 2:1 multiplexer. The output of the first 2:1 multiplexer is coupled to a first of three select inputs of the 8:1 multiplexer, and also to a first of the three inputs of the majority gate. The output of the second 2:1 multiplexer is coupled to a second of the three select inputs of the 8:1 multiplexer and also is coupled to a second of the three inputs of the majority gate. The carry-in signal $C_{IN}$ is coupled to a third of the three select inputs of the 8:1 multiplexer and is further coupled to a third of the three inputs of the majority gate. Thus, with a first set of appropriate control signals applied to the data inputs of the three named multiplexers, the unit acts as an adder by providing a sum function and a carry-out function at the output of the 8:1 multiplexer and the output of the majority gate, respectively. With a second set of appropriate control signals applied to the unit, the unit act as a subtractor. With a third set of appropriate control signals applied to the data inputs of the three multiplexers, the unit acts as an AND gate by providing a signal at the output of the 8:1 multiplexer indicative of the logic relation $(A \cdot B)$. With a fourth set of appropriate control signals applied to the data inputs of the three multiplexers, the unit acts as an OR circuit by providing a signal at the output of the 8:1 multiplexer indicative of the logic relation $(A+B)$. With a fifth set of appropriate control signals applied to the data inputs of the three multiplexers, the unit acts as an exclusive OR circuit by providing a signal at the output of the 8:1 multiplexer indicative of the logic relation $(A+B) \overline{(A \cdot B)}$. Further, with a sixth set of appropriate control signals applied to the data inputs of the three multiplexers, the unit acts as a NOR circuit by providing a signal at the output of the 8:1 multiplexer indicative of the logic relation $\overline{(A+B)}$. In accordance with one feature of the invention, an arithmetic logic system for performing arithmetic and logical functions on two input binary variables of the form $A_0, A_1, \ldots A_n$ and $B_0, B_1, \ldots B_n$ can include $(n+1)$ arithmetic logic units in which the input variables $A_0, A_1, \ldots A_n$ and $B_0, B_1, \ldots B_n$ are coupled to the first, second, ... and $(N+1)$st arithmetic logic units. The output of the majority gate of the first arithmetic logic unit is coupled to provide a carry-in signal for the second arithmetic logic unit, and so on, so that the nth arithmetic logic unit majority gate output provides a carry-in signal for the $(n+1)$st arithmetic logic unit. Thus, with a first set of appropriate control signals applied to each of the units, the overall system acts as an adder by providing a sum function at the respective outputs of the 8:1 multiplexer and by providing a carry-out function at the output of the $(n+1)$st logic unit majority gate. In accordance with a subfeature of the invention, $n=7$.

In accordance with another embodiment of the invention, a logical circuit includes a binary controlled switching circuit having n select lines, $2^2$ data signal lines, and a single output line. The switching circuit switches a signal on one of the $2^n$ data signal lines onto the output line dependent upon the binary state of signals applied to the n select lines. In a similar fashion, a second binary controlled switching circuit means having p select lines, $2^p$ data signal lines, and a single output line operates so that it switches a signal on one of its $2^p$ data signal lines onto its output line dependent upon the binary state of signals applied to its p select lines. A third binary controlled switching circuit has m select lines, $2^m$ data signal lines, and a single output line. The third circuit switches a signal on one of its $2^m$ data signal lines onto its output line dependent upon the binary state of signals applied to its m select lines. The first named switching circuit output line is coupled to one of the third circuit select lines, and the second circuit output line is coupled to a second of the third circuit select lines. The quantities n, p and m are all integers; and $m \geq n+p$. In a subfeature of the invention, $n=1$; $p=1$; and $m=3$.

In yet another embodiment of the invention, a logical circuit includes a first binary controlled switching circuit which switches a signal on one or the other of its two data signal lines onto its output line, dependent upon the binary state of a voltage level applied to its select line. A second binary controlled switching circuit switches a signal on one or the other of its two data signal lines onto its output line dependent upon the binary state of a voltage level applied to its select line. A third binary controlled switching circuit switches a signal on one of its $2^n$ data signal lines onto its output line, dependent upon the binary state of voltage levels applied to its n select lines. The first circuit output line is coupled to one of the third select lines. The second circuit output line is coupled to a second of the third circuit select lines. The quantity n is an integer greater than 1. In one feature of the invention, n is greater than 2. In accordance with a subfeature of the invention, $n=3$. In accordance with another subfeature of the invention, an electrical signal having voltage levels indicative of two different binary states is coupled to a third of the third circuit select lines. In accordance with a further subfeature of the invention, the output lines of the first and second switching circuits are coupled to two inputs of a three-input majority gate. The latter named electrical signal is coupled to a third input of the majority gate.

BRIEF DESCRIPTION OF THE DRAWINGS

FIG. 2 is a block diagram of an arithmetic logic unit for use in the block diagram of FIG. 1;

FIG. 3a is a block diagram of a 2:1 multiplexer illustrated in FIG. 2;

FIG. 3b is a truth table for the 2:1 multiplexer shown in FIG. 3a;

FIG. 4 is a diagram of an 8:1 multiplexer with specific control signals applied thereto and specific input signals A, B, and $C_{IN}$ applied to various select input terminals of such multiplexer;

For a better understanding of the present invention, together with other and further objects, advantages, features and capabilities thereof, together with its construction and mode of operation; reference is made to the following disclosure and appended claims in connection with the above-described drawings.

DESCRIPTION OF A PREFERRED EMBODIMENT

Figure 1:
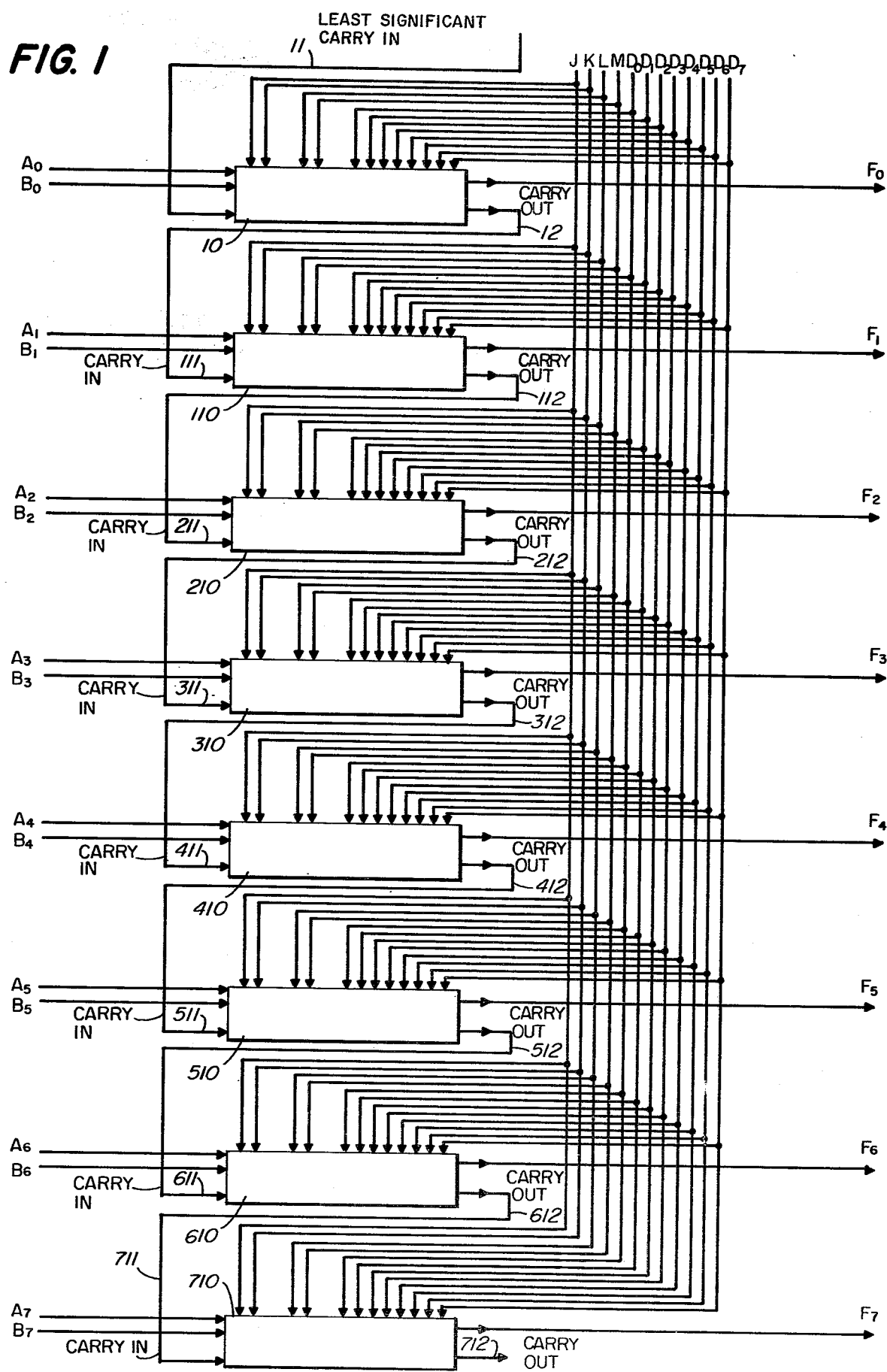
FIG. 1 is a block diagram of an arithmetic logic system in accordance with one embodiment of the invention.

Referring to FIG. 1, there is shown a block diagram of an arithmetic logic system 9 for performing arithmetic and logical functions on two input variables A and B of eight bits each. For example, 0, A·B, $\bar{A}$·B, B, A·$\bar{B}$, A, A$\oplus$B, A+B, $\overline{A+B}$, $\overline{A \oplus B}$, $\bar{A}$, $\bar{A}$+B, $\bar{B}$, A+$\bar{B}$, $\overline{A \cdot B}$, and 1. The symbol $\oplus$ represents an exclusive OR function. The more popular, and to be specifically described, functions to be performed are addition, subtraction, AND, OR, exclusive OR, and inversion. The arithmetic logic system 9 includes eight arithmetic logic units 10, 110, 210, 310, 410, 510, 610, 710, each of which can be a module, as further described in connection with FIG. 2.

The input variables A and B, respectively, formed of eight bits, can be expressed by the form $A_0, A_1, A_2, \ldots A_7$ and $B_0, B_1, B_2, \ldots B_7$, respectively. As shown in FIG. 1, the terms $A_0$ and $B_0$ are coupled to the arithmetic logic unit 10 as inputs thereto. Likewise, the input variables $A_1$ and $B_1$ are coupled to the arithmetic logic unit 110. The input variables $A_2$ and $B_2$ are coupled to the arithmetic logic unit 210. Likewise, the input variables $A_3$, $B_3$ and $A_4$ and $A_5$, $B_5$ and $A_6$, $B_6$ and $A_7$, $B_7$ are coupled, respectively, to the arithmetic logic units 310, 410, 510, 610, and 710, respectively.

Data signals J, K, L, M, $D_0$, $D_1$, $D_2$, $D_3$, $D_4$, $D_5$, $D_6$ and $D_7$ are coupled to each of the arithmetic logic units 10, 110, 210, 310, 410, 510, 610, and 710. A separate line 11 for the purpose of feeding a signal to the carry-in input of the least significant digit arithmetic logic unit 10 is provided. A sum output $F_0$ is provided from the output of the arithmetic logic unit 10. A sum output $F_1$ is provided from the output of the arithmetic logic unit 110. A sum output $F_2$ is provided from the output of the arithmetic logic unit 210. Likewise, output lines $F_3$, $F_4$, $F_5$, $F_6$, and $F_7$, respectively, provide sum outputs from the logic units 310, 410, 510, 610, and 710, respectively.

A carry-out signal 12 from the arithmetic logic unit 10 is coupled to provide a carry-in signal on a line 111 to the arithmetic logic unit 110. A carry-out signal 112 from the arithmetic logic unit 110 is coupled to provide a carry-in signal on a line 211 to the arithmetic logic unit 210. A carry out signal 212 from the arithmetic logic unit 210 is coupled to provide a carry-in signal on a line 311 to the arithmetic logic unit 310.

In similar fashion, the carry-out signals 312, 412, 512, 612 from the arithmetic logic units 310, 410, 510, 610, respectively, are coupled to provide carry-in signals on lines 411, 511, 611, 711, respectively, of the arithmetic logic units 410, 510, 610, 710, respectively. The arithmetic logic unit 710 provides a carry-out signal on a line 712.

Each of the arithmetic logic units 10, 110, 210, 310, 410, 510, 610, 710 is identical. A description of a typical arithmetic logic unit 10 is described with reference being made to FIG. 2.

Referring to FIG. 2, there is shown a 2:1 multiplexer 13 having a select input 14, two data inputs 15, 16 and an output 17. The 2:1 multiplexer 13 acts as a binary controlled switching circuit, providing an output signal indicative of a first of the two data input signals applied to the lines 15, 16 when a signal applied to the select input 14 is of one of two binary states and providing an output signal indicative of a second of the two data inputs applied to the terminals 15, 16 when the signal applied to the select terminal 14 is at the other of the two binary states. Signals J and K are applied to the data input terminals 15, 16, respectively, and the input binary variable A is applied to the select input 14.

In similar fashion, a second 2:1 multiplexer 18 is provided having a select input 19, two data inputs 20, 21, and an output 22. The second 2:1 multiplexer 18 acts as a binary controlled switching circuit which switches a signal on one or the other of the two data input terminals 20, 21 onto the output line 22, dependent upon the binary state of a signal applied to the select input terminal 19. Input variable B is applied to the select input terminal 19, and data signals L and M are applied to the data input terminals 20, 21, respectively.

An 8:1 multiplexer 23 has three select input terminals $S_0$, $S_1$, $S_2$ and eight data input terminals $D_0$, $D_1$, $D_2$, $D_3$, $D_4$, $D_5$, $D_6$, $D_7$, as shown in FIG. 4. The 8:1 multiplexer 23 has an output terminal 0 which provides a signal indicative of Sum or F (which represents a function output). The 8:1 multiplexer 23 acts as a binary controlled switching circuit to provide a first output signal indicative of a first ($D_0$) of the eight data inputs when the three select inputs $S_2$, $S_1$, $S_0$ are at 000 binary states, respectively. The 8:1 multiplexer 23 provides a second output signal indicative of a second ($D_1$) of the eight data inputs when the select terminals $S_2$, $S_1$, $S_0$ are at 001 binary states, respectively. When the select input terminals $S_2$, $S_1$, $S_0$ are at the 010 binary states, respectively, the output terminal 0 provides a signal indicative of the control signal applied to the data input terminal $D_2$. When the binary signals applied to the select input terminals $S_2$, $S_1$, $S_0$ are 011, respectively, the output terminal 0 provides a signal indicative of the control signal applied to the data input terminal $D_3$. When the binary signals applied to the select input terminals $S_2$, $S_1$, $S_0$ and 100, respectively, the output terminal 0 provides a signal indicative of the control signal which is applied to the data input terminal $D_4$. In similar logical fashion, when the signals applied to the select terminals $S_2$, $S_1$ and $S_0$ are the 101 binary states, respectively, the output terminal 0 reflects the control signal which is applied to the data terminal $D_5$. When the signal that is applied to the select terminals $S_2$, $S_1$ and $S_0$ are the 110 binary states, respectively, the output terminal 0 reflects the control signal applied to the data terminal $D_6$, and, of course, when the select terminals $S_2$, $S_1$ and $S_0$ have logic levels applied to them representative of 111 binary states, respectively, the output terminal 0 reflects the control signal which is applied to the data input terminal $D_7$. The 2:1 multiplexer 13 (FIGS. 2 and 3a) is a binary controlled switching means which provides outputs as shown by the truth table depicted in FIG. 3b. When the signal applied to the select terminal 14 of the multiplexer 13 is zero, and the control signals J and K applied to the data terminals 15, 16, respectively, are 0, 0, the output of the terminal 17 is 0. When signals J and K are applied at 0 and 1, respectively, to the data terminals 15, 16, the output terminal 17 provides an output indicative of the binary variable A applied to the select terminal 14. When the control signals J and K representing 1 and 0, respectively, are applied to the terminals 15, 16, the output at the terminal 17 inverts the signal that is applied to the select input terminal 14, so that the output from the muliplexer 13 represents the signal $\bar{A}$. When both J and K are one, maintaining the data inputs at 15, 16 at 1, 1, respectively, regardless of the input signal A applied to the select terminal 14, the output at the terminal 17 remains a 1.

The other 2:1 multiplexer 18 operates in identical fashion to that of the multiplexer 13 with the exception, of course, that control signals L and M are applied to the data input terminals 20, 21, and the binary variable B is applied to the select terminal 19.

Referring to FIG. 2, the output signal on the line 17 from the 2:1 multiplexer 13 is coupled to the select terminal $S_2$ of the 8:1 multiplexer 23. The output on the terminal 22 from the multiplexer 18 is coupled to the $S_1$ select terminal of the 8:1 multiplexer 23. A carry-in signal on the line 11 is coupled to the $S_0$ select terminal of the 8:1 multiplexer 23.

The output 17 from the 2:1 multiplexer 13, the output 22 from the 2:1 multiplexer 18, and the carry-in signal on the line 11 are each coupled, respectively, to the inputs of a majority gate 24, the output of which provides a carry-out signal on a line 12.

The majority gate 24 operates to provide an output indicative of the value of the majority of the inputs. Hence, when two or three of the three inputs applied to the majority gate represent a 0, the output thereof represents a 0. When two or three of the inputs applied to the majority gate are ones, the output signal from the majority gate becomes a one.

The arithmetic logic unit 10, as stated, in each bit slice, uses an 8:1 multiplexer 23 to create the sum or logical function and a majority gate 24 for the carry. The adder, as depicted in FIG. 1, comprising the eight bit slices 10, 210, 310, 410, 510, 610, 710, is a basic ripple carry adder. FIG. 4 illustrates the 8:1 multiplexer 23, used to realize the sum function for addition, as is well known in the prior art. By providing control signals 01101001 to the data input terminals $D_0$, $D_1$, $D_2$, $D_3$, $D_4$, $D_5$, $D_6$, $D_7$, respectively, the 8:1 multiplexer 23 provides an output at the output terminal 0 thereof indicative of the sum function of the signals A, B, and $C_{IN}$ ($C_{IN}$ being the carry-in signal) onto the select terminals $S_2$, $S_1$, and $S_0$, respectively. Thus, as shown in FIG. 4, the output signal on the terminal 0 equals $D_{(4S2+2S1+S0)}$ equals $A\bar{B}\bar{C} + \bar{A}B\bar{C} + \bar{A}\bar{B}C + ABC$. For subtraction, as will be clear hereinafter, one of the inputs is complemented, the two (A and B) are added together and a one is added via the carry-in to the lowest stage. The 2:1 multiplexers 13, 18 permit the A and B inputs to be complemented or set to 1 or 0, as shown in the truth table as set forth hereinbelow.

By applying the correct combination of logic 1's and logic 0's on the control lines, any function of A and B can be generated for F. The complete bit slice is shown in FIG. 2.

Figure 5:
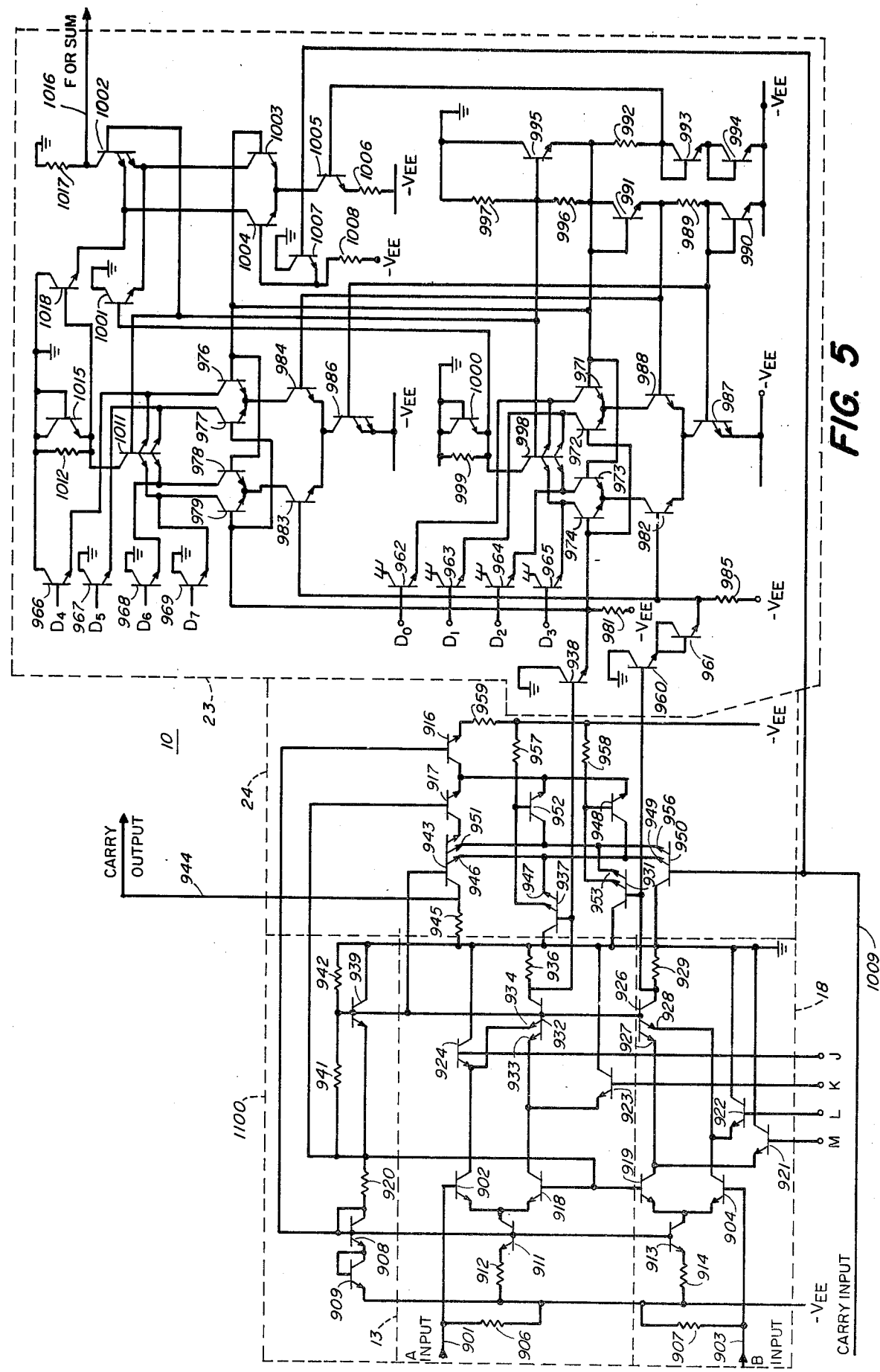
FIG. 5 is a circuit diagram of the block diagram shown in FIG. 2.

Since this invention makes use of the logical power of multi-level emitter controlled (ECL) logic, such as is shown, for example, in the best mode contemplated by the inventors in FIG. 5, this arithmetic logic unit implementation utilizes less power and area than conventional designs. Further, changing the logical functions is simplified, since it only involves changing the information on the control lines.

Although the A and B variables, in certain cases, could be fed directly into the 8:1 multiplexer 23, resulting in somewhat faster logical functions, it is contemplated that, by utilizing the 2:1 multiplexers 13, 18 in combination with the 8:1 multiplexer 23, fewer control lines would be necessary and a wider variation of logical functions could be implemented.

Thus, by utilizing the three multiplexers as described hereinabove and the majority gate, various arithmetic logic unit functions can be obtained by applying the logical inputs to the select lines, and the control signals to the data lines, thereby making efficient use of multi-level emitter controlled logic (ECL) structures.

ADDITION

When it is desired to perform an addition function or an ADD logic implementation, a low level is applied onto the line 11. Signals are then applied to the control terminals J, K, L, M, $D_0$, $D_1$, $D_2$, $D_3$, $D_4$, $D_5$, $D_6$, $D_7$ carrying the respective logic states 010101101001, reference being made to FIG. 1. When such control signals are applied to the various data terminals, the outputs $F_0$, $F_1$, $F_2$, $F_3$, $F_4$, $F_5$, $F_6$, $F_7$ and the carry-out on the line 712 provide an ADD function indicative of the signals applied to the inputs of the system 9. Each individual bit slice 10, as depicted in FIG. 2, provides an output signal F, and a carry-out signal on the line 12, indicative of an ADD logic for the signals A, B, and the carry-in signal $C_{IN}$ as shown in the Table I below.

SUBTRACTION

When it is desired to subtract, one of the input variables is complemented and a one is added to the lowest stage. In such a case, a high level is applied to the input line 11 which goes to the lowest stage of the arithmetic logic unit 9, namely, the unit 10 as shown in FIG. 1. When it is desired to subtract B from A, the control signals applied on the terminals L and M are reversed so that line L is maintained at a one state and line M is maintained at a zero state, whereas the lines applied to the data terminals J, K remain at 0 and 1, respectively, as shown in Table II below. When it is desired to subtract A from B, as indicated in Table III, the J, K, L and M states are kept at 1001, respectively. In both cases, the signals applied to the data terminals $D_0$, $D_1$, $D_2$, $D_3$, $D_4$, $D_5$, $D_6$, $D_7$ are kept at 01101001 as was maintained in the ADD condition as shown in Table I.

When it is desired to subtract B from A, and the high level is applied to the input terminal 11 as stated hereinabove, the subtraction function is represented on the output function lines $F_0$, $F_1$, $F_2$, $F_3$, $F_4$, $F_5$, $F_6$, $F_7$. A carry-out signal is provided from the most significant stage 710 on the line 712 representative of a 1. When the last stage carry-out is a 1, the signals that appear on the function lines $F_0$ through $F_7$ represent the true binary remainder (in inverse order). The true remainder in binary fashion, of course, would be $F_7$, $F_6$, $F_5$, $F_4$, $F_3$, $F_2$, $F_1$, $F_0$ in conventional notation, whereas $F_0$ represents the least significant bit and $F_7$ represents the most significant bit. In the event that the last stage carry-out signal on the line 712 is a 0, two things become apparant. First, the value of the input variable B is greater than the input variable A, and second, the signal on the output lines $F_7$, $F_6$, ... $F_0$ represent a two's complement of the actual remainder (in binary notation).

The same is true, in a corresponding fashion, when it is desired to subtract A from B. When the last stage carry-out is a 1, A is less than B, and the outputs appearing on the terminals $F_7$, $F_6$, ... $F_0$ represent the true binary remainder indicative of the subtraction of the two input variables. When the last stage carry-out on the line 712 is a 0, then A is greater than B, and the binary number appearing on the lines $F_7$, $F_6$, ... $F_0$ is a two's complement of the true remainder.

TABLE 1

| Input Signals | | | Add Control Signals | | | | | | | | | | | Select Signals | | | | Carry Out |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | |
| 0 | 0 | 0 | 0 | 1 | 0 | 1 | 0 | 1 | 1 | 0 | 1 | 0 | 0 | 1 | 0 | 0 | 0 | 0 | 0 |
| 0 | 0 | 1 | 0 | 1 | 0 | 1 | 0 | 1 | 1 | 0 | 1 | 0 | 0 | 1 | 0 | 0 | 1 | 1 | 0 |
| 0 | 1 | 0 | 0 | 1 | 0 | 1 | 0 | 1 | 1 | 0 | 1 | 0 | 0 | 1 | 0 | 1 | 0 | 1 | 0 |
| 0 | 1 | 1 | 0 | 1 | 0 | 1 | 0 | 1 | 1 | 0 | 1 | 0 | 0 | 1 | 0 | 1 | 1 | 0 | 1 |
| 1 | 0 | 0 | 0 | 1 | 0 | 1 | 0 | 1 | 1 | 0 | 1 | 0 | 0 | 1 | 1 | 0 | 0 | 1 | 0 |
| 1 | 0 | 1 | 0 | 1 | 0 | 1 | 0 | 1 | 1 | 0 | 1 | 0 | 0 | 1 | 1 | 0 | 1 | 0 | 1 |
| 1 | 1 | 0 | 0 | 1 | 0 | 1 | 0 | 1 | 1 | 0 | 1 | 0 | 0 | 1 | 1 | 1 | 0 | 0 | 1 |
| 1 | 1 | 1 | 0 | 1 | 0 | 1 | 0 | 1 | 1 | 0 | 1 | 0 | 0 | 1 | 1 | 1 | 1 | 1 | 1 |

TABLE II

| INPUT SIGNALS | | | SUBTRACT (A−B) CONTROL SIGNALS | | | | | | | | | | | SELECT SIGNALS | | | | CARRY OUT |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | |
| 0 | 0 | 0 | 0 | 1 | 1 | 0 | 0 | 1 | 1 | 0 | 1 | 0 | 0 | 1 | 0 | 1 | 0 | 1 | 0 |
| 0 | 0 | 1 | 0 | 1 | 1 | 0 | 0 | 1 | 1 | 0 | 1 | 0 | 0 | 1 | 0 | 1 | 1 | 0 | 1 |
| 0 | 1 | 0 | 0 | 1 | 1 | 0 | 0 | 1 | 1 | 0 | 1 | 0 | 0 | 1 | 0 | 0 | 0 | 0 | 0 |
| 0 | 1 | 1 | 0 | 1 | 1 | 0 | 0 | 1 | 1 | 0 | 1 | 0 | 0 | 1 | 0 | 0 | 1 | 1 | 0 |
| 1 | 0 | 0 | 0 | 1 | 1 | 0 | 0 | 1 | 1 | 0 | 1 | 0 | 0 | 1 | 1 | 1 | 0 | 0 | 1 |
| 1 | 0 | 1 | 0 | 1 | 1 | 0 | 0 | 1 | 1 | 0 | 1 | 0 | 0 | 1 | 1 | 1 | 1 | 1 | 1 |
| 1 | 1 | 0 | 0 | 1 | 1 | 0 | 0 | 1 | 1 | 0 | 1 | 0 | 0 | 1 | 1 | 0 | 0 | 1 | 0 |
| 1 | 1 | 1 | 0 | 1 | 1 | 0 | 0 | 1 | 1 | 0 | 1 | 0 | 0 | 1 | 1 | 0 | 1 | 0 | 1 |

FIRST STAGE ONLY (LEAST SIGNIFICANT BIT), CARRY-IN ($C_{IN}$) = 1. LAST STAGE CARRY-OUT MUST BE A 1, OTHERWISE B > A.

TABLE III

| INPUT SIGNALS | | | SUBTRACT (B−A) CONTROL SIGNALS | | | | | | | | | | | SELECT SIGNALS | | | | CARRY OUT |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | |
| 0 | 0 | 0 | 1 | 0 | 0 | 1 | 0 | 1 | 1 | 0 | 1 | 0 | 0 | 1 | 1 | 0 | 0 | 1 | 0 |
| 0 | 0 | 1 | 1 | 0 | 0 | 1 | 0 | 1 | 1 | 0 | 1 | 0 | 0 | 1 | 1 | 0 | 1 | 0 | 1 |
| 0 | 1 | 0 | 1 | 0 | 0 | 1 | 0 | 1 | 1 | 0 | 1 | 0 | 0 | 1 | 1 | 1 | 0 | 0 | 1 |
| 0 | 1 | 1 | 1 | 0 | 0 | 1 | 0 | 1 | 1 | 0 | 1 | 0 | 0 | 1 | 1 | 1 | 1 | 1 | 1 |
| 1 | 0 | 0 | 1 | 0 | 0 | 1 | 0 | 1 | 1 | 0 | 1 | 0 | 0 | 1 | 0 | 0 | 0 | 0 | 0 |
| 1 | 0 | 1 | 1 | 0 | 0 | 1 | 0 | 1 | 1 | 0 | 1 | 0 | 0 | 1 | 0 | 0 | 1 | 1 | 0 |
| 1 | 1 | 0 | 1 | 0 | 0 | 1 | 0 | 1 | 1 | 0 | 1 | 0 | 0 | 1 | 0 | 1 | 0 | 1 | 0 |
| 1 | 1 | 1 | 1 | 0 | 0 | 1 | 0 | 1 | 1 | 0 | 1 | 0 | 0 | 1 | 0 | 1 | 1 | 0 | 1 |

FIRST STAGE ONLY (LEAST SIGNIFICANT BIT), CARRY-IN ($C_{IN}$) = 1. LAST STAGE CARRY-OUT MUST BE A "ONE", OTHERWISE A > B.

THE AND GATE

When it is desired to use a bit slice 10 as an AND gate, to represent an AND function for the input variables A and B, the control signals applied to the data input terminals J, K, L, M, $D_0$, $D_1$, $D_2$, $D_3$, $D_4$, $D_5$, $D_6$, $D_7$ are maintained at logic levels 010100000011, respectively. In such case, the value at the output terminal 0, for the function F, represents the logical AND (A·B) for the input variables A and B, as shown in TABLE IV below.

THE OR CIRCUIT

When it is desired to perform an OR function (A+B), the control signals applied to the data input terminals J, K, L, M, $D_0$, $D_1$, $D_2$, $D_3$, $D_4$, $D_5$, $D_6$, $D_7$, are set at 010100111111, respectively, and with such, the bit slice 10 acts as an OR circuit for the input variables A and B, providing an output at the terminal 0 to provide the function F. As shown in the truth table, TABLE V below, the value of F represents an OR function for the input variables A and B applied thereto.

EXCLUSIVE OR

When it is desired to perform an exclusive OR function (A+B) $\overline{(A \cdot B)}$, the control signals applied to the data input terminals J, K, L, M, $D_0$, $D_1$, $D_2$, $D_3$, $D_4$, $D_5$, $D_6$, $D_7$ are set at 010100111100, respectively. As such, the bit slice 10 operates as an exclusive OR circuit as shown in TABLE VI below.

THE NOR CIRCUIT

When it is desired to have the bit slice 10 operate as a NOR circuit $\overline{(A+B)}$, the signals to be applied to the data input terminals J, K, L, M, $D_0$, $D_1$, $D_2$, $D_3$, $D_4$, $D_5$, $D_6$, $D_7$ are set at 101000000011, respectively. In such case, the output function F at the output terminal 0 represents a NOR function for the input variables A and B, respectively, as shown in Table VII below.

TABLE IV

| INPUT SIGNALS | | | AND (A·B) CONTROL SIGNALS | | | | | | | | | | | SELECT SIGNALS | | | | CARRY |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | OUT |
| 0 | 0 | 0 | 0 | 1 | 0 | 1 | 0 | 0 | 0 | 0 | 0 | 0 | 1 | 1 | 0 | 0 | 0 | 0 | 0 |
| 0 | 0 | 1 | 0 | 1 | 0 | 1 | 0 | 0 | 0 | 0 | 0 | 0 | 1 | 1 | 0 | 0 | 1 | 0 | 0 |
| 0 | 1 | 0 | 0 | 1 | 0 | 1 | 0 | 0 | 0 | 0 | 0 | 0 | 1 | 1 | 0 | 1 | 0 | 0 | 0 |
| 0 | 1 | 1 | 0 | 1 | 0 | 1 | 0 | 0 | 0 | 0 | 0 | 0 | 1 | 1 | 0 | 1 | 1 | 0 | 1 |
| 1 | 0 | 0 | 0 | 1 | 0 | 1 | 0 | 0 | 0 | 0 | 0 | 0 | 1 | 1 | 1 | 0 | 0 | 0 | 0 |
| 1 | 0 | 1 | 0 | 1 | 0 | 1 | 0 | 0 | 0 | 0 | 0 | 0 | 1 | 1 | 1 | 0 | 1 | 0 | 1 |
| 1 | 1 | 0 | 0 | 1 | 0 | 1 | 0 | 0 | 0 | 0 | 0 | 0 | 1 | 1 | 1 | 1 | 0 | 1 | 1 |
| 1 | 1 | 1 | 0 | 1 | 0 | 1 | 0 | 0 | 0 | 0 | 0 | 0 | 1 | 1 | 1 | 1 | 1 | 1 | 1 |

TABLE V

| INPUT SIGNALS | | | OR (A+B) CONTROL SIGNALS | | | | | | | | | | | SELECT SIGNALS | | | | CARRY |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | OUT |
| 0 | 0 | 0 | 0 | 1 | 0 | 1 | 0 | 0 | 1 | 1 | 1 | 1 | 1 | 1 | 0 | 0 | 0 | 0 | 0 |
| 0 | 0 | 1 | 0 | 1 | 0 | 1 | 0 | 0 | 1 | 1 | 1 | 1 | 1 | 1 | 0 | 0 | 1 | 0 | 0 |
| 0 | 1 | 0 | 0 | 1 | 0 | 1 | 0 | 0 | 1 | 1 | 1 | 1 | 1 | 0 | 1 | 0 | 1 | 0 | |
| 0 | 1 | 1 | 0 | 1 | 0 | 1 | 0 | 0 | 1 | 1 | 1 | 1 | 1 | 1 | 0 | 1 | 1 | 1 | 1 |
| 1 | 0 | 0 | 0 | 1 | 0 | 1 | 0 | 0 | 1 | 1 | 1 | 1 | 1 | 1 | 1 | 0 | 0 | 1 | 0 |
| 1 | 0 | 1 | 0 | | 0 | 1 | 0 | 0 | 1 | 1 | 1 | 1 | 1 | 1 | 1 | 0 | 1 | 1 | 1 |
| 1 | 1 | 0 | 0 | 1 | 0 | 1 | 0 | 0 | 1 | 1 | 1 | 1 | 1 | 1 | 1 | 1 | 0 | 1 | 1 |
| 1 | 1 | 1 | 0 | 1 | 0 | 1 | 0 | 0 | 1 | 1 | 1 | 1 | 1 | 1 | 1 | 1 | 1 | 1 | 1 |

TABLE VI

| INPUT SIGNALS | | | EXCULSIVE "OR" (A + B) $\overline{(A \cdot B)}$ CONTROL SIGNALS | | | | | | | | | | | SELECT SIGNALS | | | | CARRY |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | OUT |
| 0 | 0 | 0 | 0 | 1 | 0 | 1 | 0 | 0 | 1 | 1 | 1 | 1 | 0 | 0 | 0 | 0 | 0 | 0 | 0 |
| 0 | 0 | 1 | 0 | 1 | 0 | 1 | 0 | 0 | 1 | 1 | 1 | 1 | 0 | 0 | 0 | 0 | 1 | 0 | 0 |
| 0 | 1 | 0 | 0 | 1 | 0 | 1 | 0 | 0 | 1 | 1 | 1 | 1 | 0 | 0 | 0 | 1 | 0 | 1 | 0 |
| 0 | 1 | 1 | 0 | 1 | 0 | 1 | 0 | 0 | 1 | 1 | 1 | 1 | 0 | 0 | 0 | 1 | 1 | 1 | 1 |
| 1 | 0 | 0 | 0 | 1 | 0 | 1 | 0 | 0 | 1 | 1 | 1 | 1 | 0 | 0 | 1 | 0 | 0 | 1 | 0 |
| 1 | 0 | 1 | 0 | 1 | 0 | 1 | 0 | 0 | 1 | 1 | 1 | 1 | 0 | 0 | 1 | 0 | 1 | 1 | 1 |
| 1 | 1 | 0 | 0 | 1 | 0 | 1 | 0 | 0 | 1 | 1 | 1 | 1 | 0 | 0 | 1 | 1 | 0 | 0 | 1 |
| 1 | 1 | 1 | 0 | 1 | 0 | 1 | 0 | 0 | 1 | 1 | 1 | 1 | 0 | 0 | 1 | 1 | 1 | 0 | 1 |

TABLE VII

| INPUT SIGNALS | | | NOR $\overline{(A + B)}$ CONTROL SIGNALS | | | | | | | | | | | SELECT SIGNALS | | | | CARRY |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | OUT |
| 0 | 0 | 1 | 1 | 0 | 1 | 0 | 0 | 0 | 0 | 0 | 0 | 1 | 1 | 1 | 1 | 0 | 1 | 1 | |
| 0 | 0 | 1 | 1 | 0 | 1 | 0 | 0 | 0 | 0 | 0 | 0 | 1 | 1 | 1 | 1 | 1 | 1 | 1 | |
| 0 | 1 | 0 | 1 | 0 | 1 | 0 | 0 | 0 | 0 | 0 | 0 | 1 | 1 | 1 | 0 | 0 | 0 | 0 | |
| 0 | 1 | 1 | 1 | 0 | 1 | 0 | 0 | 0 | 0 | 0 | 0 | 1 | 1 | 1 | 0 | 1 | 0 | 1 | |
| 1 | 0 | 0 | 1 | 0 | 1 | 0 | 0 | 0 | 0 | 0 | 0 | 1 | 1 | 0 | 1 | 0 | 0 | 0 | |
| 1 | 0 | 1 | 1 | 0 | 1 | 0 | 0 | 0 | 0 | 0 | 0 | 1 | 1 | 0 | 1 | 1 | 0 | 1 | |
| 1 | 1 | 0 | 1 | 0 | 1 | 0 | 0 | 0 | 0 | 0 | 0 | 1 | 1 | 0 | 0 | 0 | 0 | 0 | |

TABLE VII-continued

| INPUT SIGNALS | | | NOR (A + B) CONTROL SIGNALS | | | | | | | | | | | SELECT SIGNALS | | | | CARRY OUT |
|---|---|---|---|---|---|---|---|---|---|---|---|---|---|---|---|---|---|---|
| A | B | $C_{IN}$ | J | K | L | M | $D_0$ | $D_1$ | $D_2$ | $D_3$ | $D_4$ | $D_5$ | $D_6$ | $D_7$ | $S_2$ | $S_1$ | $S_0$ | F | |
| 1 | 1 | 1 | 1 | 0 | 1 | 0 | 0 | 0 | 0 | 0 | 0 | 0 | 1 | 1 | 0 | 0 | 1 | 0 | 0 |

IN GENERAL

Figure 6:
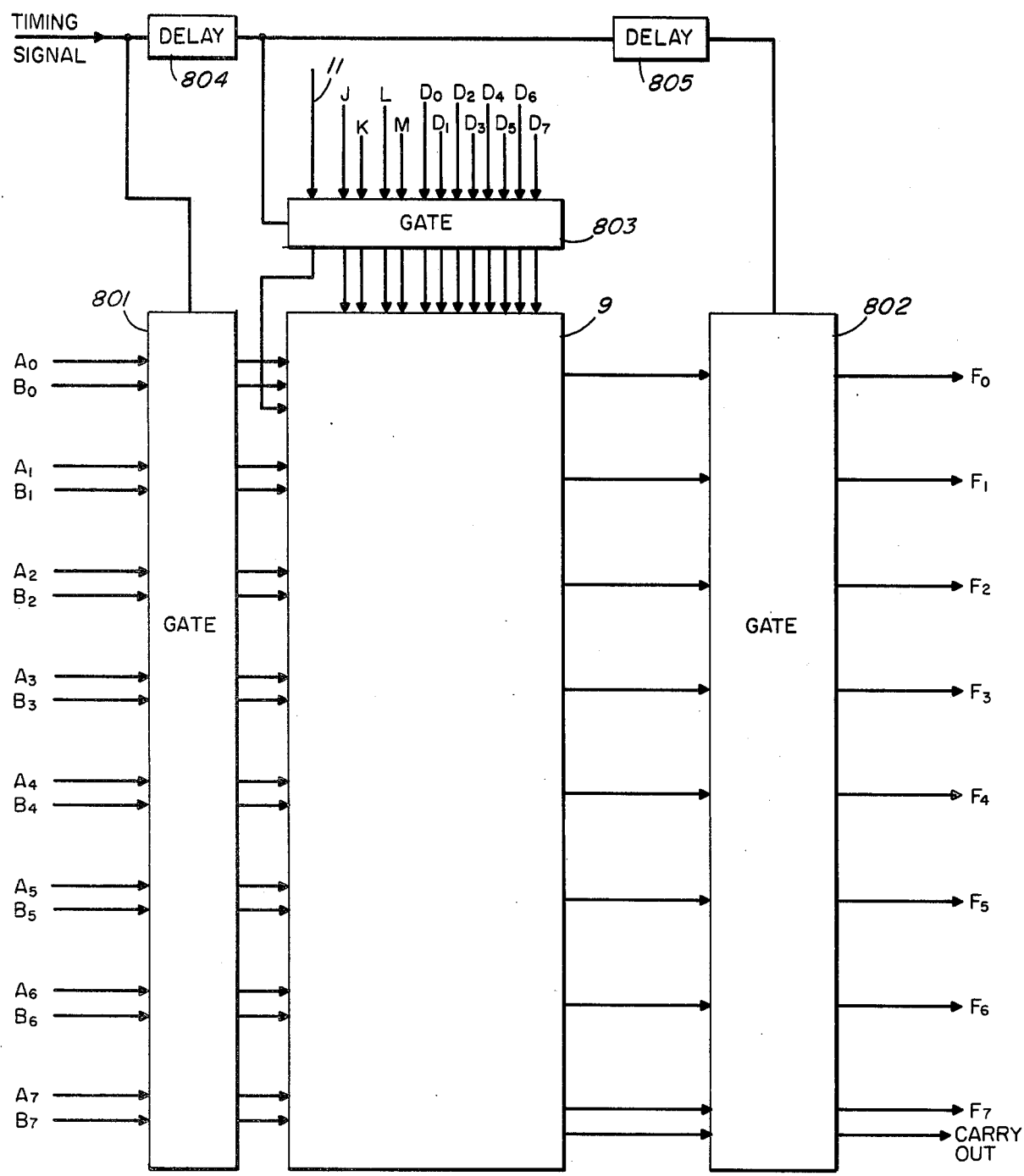
FIG. 6 is a block diagram illustrating how a timing signal can control the results of the system shown in FIG. 1.

The arithmetic logic system 9 can be used with other circuitry in known desired manner. In some cases, it may be desired to time the various signals either through the use of gates, flip flops, and the like. For example, as shown in FIG. 6, the input variables A ($A_0$, $A_1$, ... $A_7$) and B ($B_0$, $B_1$, ... $B_7$) can be applied to a gate 801, the outputs of the gate being coupled to the inputs of the arithmetic logic system 9. The outputs of the arithmetic logic system 9 can be coupled to another gate 802, the outputs of the gate 802 providing the output functions $F_0$, $F_1$, $F_2$, ... $F_7$ and a carryout signal. The various control signals 11, J, K, L, M, $D_0$, $D_1$, $D_2$, $D_3$, $D_4$, $D_5$, $D_6$, $D_7$ can be coupled to a third gate 803, the outputs of which are coupled to the arithmetic logic system 9.

A timing signal, which can be a pulse, is directly applied to open the gate 801 to permit the input variables A and B to pass therethrough to the arithmetic logic system 9. The timing signal is also coupled via a delay 804 to open the gate 803 to permit the various control signals to pass therethrough to the data input terminals of the arithmetic logic system 9. The delay 804 can be insignificant. The output of the delay 804 is coupled to a delay circuit 805, the output of which opens the gate 802 to permit the outputs of the arithmetic logic system 9 to pass therethrough.

The delay time of the delay circuit 805 is sufficient to permit the carry ripple for the arithmetic logic system 9 to ripple through the various stages so that the arithmetic logic system 9 has achieved a steady state output. The timing signal from the output of the delay circuit 805 opens the gate 802 to provide the proper outputs onto the lines $F_0$, $F_1$, ... $F_7$ and a carry-out. The gates 801, 802, 803 can be gates as are conventionally known, or, further, one or more may be a set of flip flops which may be reset by a reset signal.

DESCRIPTION OF FIG. 5

Referring to FIG. 5, there is shown a diagram of a circuit suitable for carrying out the invention shown in the block diagram of FIG. 2. The various components can be discrete elements, or can be formed on one or more integrated circuit chips. In one model constructed by the applicants, one integrated circuit chip was used.

In a preferred embodiment, all transistors are of the same conductivity type. In the description that follows, all transistors mentioned are of the N-conductivity type. Of course, an appropriate equivalent circuit can be constructed using P-conductivity type transistors by merely reversing polarity of the signals, bias voltages, and the like.

Referring again to FIG. 5, the input signal for the A variable is coupled along a line 901 to the base of a transistor 902. The input variable B is coupled along a line 903 to the base of a transistor 904. The line 901 is coupled via a resistor 906 to a bias source $-V_{EE}$. Likewise, the line 903 is coupled through a resistor 907 to the bias source $-V_{EE}$. A transistor 908 has its emitter coupled to the collector of a transistor 909 whose emitter is coupled to the bias source $-V_{EE}$. The collector and the base of the transistor 909 are coupled together. A transistor 911 has its emitter coupled, via a resistor 912, to the bias source $-V_{EE}$. A transistor 913 has its emitter coupled, via a resistor 914, to the bias source $-V_{EE}$. The bases of transistors 908, 911, 913, 916 are coupled together. The bases of transistors 917, 918, 919, which are coupled together, are coupled, via a resistor 920, to the collector and base of the transistor 908.

The emitters of the transistors 902, 918 are coupled together to the collector of the transistor 911. The emitters of the transistors 904, 919 are coupled together to the collector of the transistor 913. A control signal M is coupled to the base of a transistor 921 whose emitter is coupled to the collector of the transistor 919. The collector of the transistor 921 is coupled to a point of reference potential, such as ground.

The control signal L is coupled to the base of a transistor 922 whose emitter is coupled to the collector of the transistor 904. The collector of the transistor 922 is coupled to a point of reference potential, such as ground.

The control signal K is coupled to the base of a transistor 923 whose emitter is coupled to the collector of the transistor 918. The collector of the transistor 923 is coupled to a point of reference potential, such as ground.

The control signal J is coupled to the base of a transistor 924 whose emitter is coupled to the collector of the transistor 902. The collector of the transistor 924 is coupled to a point of reference potential, such as ground.

A double emitter transistor 926 has one of its emitters 927 coupled to the collector of the transistor 919. The other emitter 928 of the double emitter transistor 926 is coupled to the collector of the transistor 904. The collector of the transistor 926 is coupled via a resistor 929 to a point of reference potential. The collector of the transistor 926 also is coupled directly to the base of another double emitter transistor 931. The collector of the transistor 931 is coupled to a point of reference potential, such as ground.

A double emitter transistor 932 has one of its emitters 933 coupled to the collector of the transistor 918. The other emitter 934 is coupled to the collector of the transistor 902 in addition to being coupled to the emitter of the transistor 924. The collector of the transistor 932 is coupled through a resistor 936 to a point of reference potential, such as ground. Further, the collector of the transistor 932 is coupled to the base of a double emitter transistor 937. Further, the collector of the transistor 932 is also coupled to the base of a transistor 938. The collectors of the transistor 937, 938 are coupled to a point of reference potential, such as ground.

A transistor 939 has its emitter coupled to the resistor 920 and also to the bases of the transistors 918 and 919. A resistor 941 is coupled across the emitter and the base of the transistor 939. A resistor 942 is coupled between the base and the collector of the transistor 939, the collector of the transistor 939 being coupled to a point of reference potential, such as ground. The bases of the transistors 939, 932, 926 are coupled to each other, via a common line, and are also coupled to the base of a triple-emitter transistor 943.

The collector of the triple-emitter transistor 943 is coupled to a carry-output line 944 and is also coupled via a resistor 945 to a point of reference potential, such as ground. One emitter 946 of the transistor 943 is coupled to one 947 of the emitters of the transistor 937 which is also coupled to a collector of a transistor 948 and is also coupled to an emitter 949 of a double emitter transistor 950.

A second emitter 951 of the triple emitter transistor 943 is coupled to a collector of a transistor 952, and is also coupled to the second emitter 953 of the double emitter transistor 931. The third emitter of the triple emitter transistor 943 is coupled to the collector of the transistor 917. The second emitter 951 of the triple emitter transistor 943 is also coupled to the second emitter 956 of the transistor 950.

The base of the transistor 952 is coupled to one of the emitters of the transistor 937. Likewise, the base of the transistor 948 is coupled to one of the emitters of the transistor 931. The base of the transistor 952 is coupled via a resistor 957 to the bias potential $-V_{EE}$. The base of the transistor 948 is coupled via a resistor 958 to the bias potential $-V_{EE}$.

The emitter of the transistor 916 is coupled via a resistor 959 to the bias potential $-V_{EE}$.

The collector of the transistor 926 is coupled to the base of a transistor 960. The collector of the transistor 960 is coupled to a point of reference potential, such as ground, whereas the emitter of the transistor 960 is coupled both to the collector and base of a transistor 961.

The collector of the transistor 916 is coupled to the emitter of the transistors 917, 952, 948.

Control signals $D_0$, $D_1$, $D_2$, $D_3$, $D_4$, $D_5$, $D_6$, $D_7$ are coupled respectively to the bases of the N-type transistors 962, 963, 964, 965, 966, 967, 968, and 969. The collectors of the transistors 962–969 are each coupled to a point of reference potential, such as ground.

The emitter of the transistor 962 is coupled to the collector of a transistor 971. The emitter of the transistor 963 is coupled to the collector of a transistor 972. The emitter of the transistor 964 is coupled to the collector of a transistor 973. The emitter of the transistor 965 is coupled to the collector of a transistor 974.

The emitter of the transistor 966 is coupled to the collector of a transistor 976; the emitter of the transistor 967 is coupled to the collector of a transistor 977. The emitter of the transistor 968 is coupled to the collector of a transistor 978; and the emitter of the transistor 969 is coupled to the collector of a transistor 979.

The emitter of the transistor 938 is coupled to the base of the transistor 974 and also to the base of the transistor 972. The emitter of the transistor 938 is also coupled to the base of the transistor 979 and to the base of the transistor 977. In addition, the emitter of the transistor 938 is coupled via a resistor 981 to the bias source $-V_{EE}$.

The emitter of the transistor 961 is coupled to the base of a transistor 982 and also to the base of a transistor 983. Further, the emitter of the transistor 961 is coupled via a resistor 985 to the bias source $-V_{EE}$.

The collector of the transistor 982 is coupled to both emitters of the transistors 973, 974.

The emitters of the transistors 978, 979 are coupled together to the collector of the transistor 983. The emitters of the transistors 976, 977 are coupled together to the collector of a transistor 984. The emitters of both transistors 984, 983 are coupled together to the collector of a double emitter transistor 986 whose two emitters are coupled to the bias source $-V_{EE}$.

The base of the double emitter transistor 986 is coupled to the base of another double emitter transistor 987 whose two emitters are coupled to the bias source $-V_{EE}$. The collector of the transistor 987 is coupled to the emitter of the transistor 982 and also to the emitter of a transistor 988 whose collector is coupled to the emitters of the transistors 971, 972. The base of the transistor 988 is coupled via a resistor 989 to both the collector and base of a transistor 990 whose emitter is coupled to the bias source $-V_{EE}$. The base of the transistor 988 is coupled to the base of the transistor 984. The collector and base of the transistor 990 are also coupled to the base of the transistor 987, and also to the base of the transistor 986.

The base of the transistor 988 is also coupled to the emitter of a transistor 991 whose collector and base are coupled together to the base of the transistor 971 and also via a resistor 992 to the collector of a transistor 993 whose base is also coupled to its collector. The emitter of the transistor 993 is coupled to the base and to the collector of a transistor 994 whose emitter is coupled to the bias source $-V_{EE}$.

The collector of the transistor 991 is coupled to the emitter of a transistor 995 whose collector is coupled to a point of reference potential, such as ground. A resistor 996 couples the base and emitter of the transistor 995 together, whereas a resistor 997 is coupled across the base and collector of the transistor 995.

The base of the transistor 995 is directly coupled to the base of a four emitter transistor 998. One of the emitters of the transistor 998 is coupled to the collector of the transistor 973 and is also coupled to the emitter of the transistor 964. A second emitter of the transistor 998 is coupled to the collector of the transistor 974 and is also coupled to the emitter of the transistor 965. A third emitter of the transistor 998 is coupled to the collector of the transistor 972 and is also coupled to the emitter of the transistor 963. A fourth emitter of the transistor 998 is coupled to the collector of the transistor 971 and is also to the emitter of the transistor 962. The collector of the transistor 998 is coupled first via a resistor 999 to a point of reference potential, such as ground. The collector 998 is also coupled to an emitter of a transistor 1000 whose base and collector are also coupled to a point of reference potential, such as ground. The collector of the transistor 998 is also coupled to the base of a transistor 1001 whose collector is coupled to a point of reference potential, such as ground, and whose emitter is coupled to one emitter of a double emitter transistor 1002, such one emitter being coupled to the collector of a transistor 1003. The other emitter of the transistor 1002 is coupled to the collector of a transistor 1004. The emitters of the transistors 1003 and 1004 are coupled to the collector of a transistor 1005 whose base is coupled to the collector of the transistor 993. The emitter of the transistor 1005 is coupled via a resistor 1006 to the bias source $-V_{EE}$. The base of the transistor 1003 is coupled to the bases of the transistors 971, 973, 976, 978, and 991.

The base of the transistor 1004 is coupled to the emitter of a transistor 1007 and is also coupled via a resistor 1008 to the bias source $-V_{EE}$. The collector of the transistor 1007 is coupled to a point of reference, such as ground, whereas the base of the transistor 1007 is coupled to the carry-input signal which is provided on the line 1009. The carry-input signal on the line 1009 is also coupled to the base of the transistor 950 whose collector is coupled to a point of reference potential, such as ground.

The base of the transistor 1002 is coupled to the base of a four emitter transistor 1011. The base of the transistor 1002 is also coupled to the bases of the transistors 995, 998. One of the emitters of the transistor 1011 is coupled to the emitter of the transistor 969 and to the collector of the transistor 979. A second emitter of the transistor 1011 is coupled both to the emitter of the transistor 968 and also to the collector of the transistor 978. A third emitter of the transistor 1011 is coupled both to the emitter of the transistor 966 and to the collector of the transistor 976. The fourth emitter of the transistor 1011 is coupled to the emitter of the transistor 967 and also to the collector of the transistor 977.

A resistor 1012 is coupled across the collector of the transistor 1011 and a point of reference potential, such as ground. A transistor 1015 has its emitter coupled to the collector of the transistor 1011. The collector and base of the transistor 1015 are coupled to a point of reference potential, such as ground.

The collector of the transistor 1002 is coupled via a line 1016 to provide an output signal indicative of the function F or of a sum. The line 1016 is coupled via a resistor 1017 to a point of reference potential, such as ground.

The emitter of the transistor 1015 is coupled to the base of a transistor 1018 whose collector and emitter, respectively, are coupled to a point of reference potential, such as ground, and to the collector of the transistor 1004, respectively.

Suitable values for the various resistors are shown in the table below:

| RESISTORS | VALUE (ohms) | RESISTORS | VALUE (ohms) |
|---|---|---|---|
| 906 | 5K | 959 | 300 |
| 907 | 5K | 981 | 12K |
| 912 | 1.2K | 985 | 10K |
| 914 | 1.2K | 999 | 2K |
| 920 | 3.7K | 1012 | 2K |
| 941 | 3K | 1008 | 12K |
| 942 | 1.5K | 996 | 3K |
| 936 | 1.2K | 997 | 1.5K |
| 929 | 1.2K | 989 | 7.4K |
| 945 | 300 | 1017 | 1.2K |
| 957 | 12K | 1006 | 1.2K |
| 958 | 12K | 992 | 7.4K |

Referring to FIG. 5, the ground potential, preferably, is at 0 volt potential. The bias source $-V_{EE}$ is set at $-4$ volt potential, in accordance with a preferred embodiment of the invention.

IN OPERATION

As shown in FIG. 5, those elements enclosed within the dotted outline 13 act as the first 2:1 multiplexer. Those elements enclosed within the dotted outline 18 act as the second 2:1 multiplexer. Those elements enclosed within the dotted outline 23 act as the 8:1 multiplexer. Those elements within the dotted outline 24 act as a majority gate. The dotted outline marked 1100 designates a common voltage supply for the 2:1 multiplexer 13, 18 and the majority gate 24.

While there has been shown and described what is at present considered the preferred embodiment of the invention, it will be obvious to those skilled in the art that various changes and modifications may be made therein without departing from the scope of the invention as defined by the appended claims.

While references are made hereinabove to multi-level emitter controlled logic, it is, of course, to be understood that this invention is applicable to other types of circuitry. Though the invention can be used with arithmetic logic units, each being constructed on a single chip, and the overall arithmetic logic system can include eight chips for an eight bit system, it is the intent of the applicants to provide an overall arithmetic logic system using a single chip or to provide even larger systems on one chip. Furthermore, it is understood that two or more chips can be used. Various other modifications will suggest themselves to those skilled in the art.

What is claimed is:

1. A logical circuit comprising:
   a first binary controlled switching circuit means having one select line, two data signal lines, and a single output line, said first means switching a signal on one or the other of said two data signal lines onto said output line dependent upon the binary state of a voltage level applied to said select line;
   a secondary binary controlled switching circuit means having one select line, two data signal lines, and a single output line, said second means switching a signal on one or the other of said second means two data signal lines onto said second means output line dependent upon the binary state of a voltage level applied to said second means select line;
   a third binary controlled switching circuit means having n select lines, $2^n$ data signal lines, and a single output line, said third means switching a signal on one of said third means $2^n$ data signal lines onto said third means output line dependent upon the binary state of voltage levels applied to said third means n select lines;
   means coupling said first means output line to one of said third means select lines; and
   means coupling said second means output line to a second of said third means select lines; wherein n is an integer greater than one.

2. The circuit as recited in claim 1, wherein n is greater than 2.

3. The circuit as recited in claim 2, wherein n equals 3.

4. The circuit as recited in claim 2 further comprising:
   means for receiving an electrical signal at voltage levels indicative of two different binary states; and
   means coupling said receiving means to a third of said third means select lines.

5. The circuit as recited in claim 4 further comprising:
   majority gate means having at least three inputs and an output for providing an output level at one of two binary states onto said gate means output when signal levels indicative of one binary state are applied to a majority of said gate means inputs, and for providing an output level at the other of two binary states onto said gate means output when signal levels indicative of the other binary state are applied to a majority of said gate means inputs;
   means coupling said first means output line to a first input of said majority gate means;
   means coupling said second means output line to a second input of said majority gate means; and means coupling said receiving means to a third input of said majority gate means.

6. An arithmetic logic unit for performing arithmetic and logical functions on two input binary variables A and B, and a carry-in signal $C_{IN}$ comprising:
- a first 2:1 multiplexer means having a select input, two data inputs, and an output, said first 2:1 multiplexer means providing an output signal indicative of a first of said two data inputs when said select input is at one of two binary states and providing an output signal indicative of a second of said two data inputs when said select input is at the other of two binary states;
- a second 2:1 multiplexer means having a select input, two data inputs, and an output, said second 2:1 multiplexer means providing an output signal indicative of a first of two data inputs applied to said second multiplexer means when said second multiplexer means select input is at one of two binary states and providing an output signal indicative of a second of said two data inputs of said second multiplexer means when said select input of said second multiplexer means is at the other of said binary states;
- an 8:1 multiplexer means having three select inputs, eight data inputs, and an output, said 8:1 multiplexer means providing:
  (a) a first output signal indicative of a first of said eight data inputs when said three select inputs are at one, one, and one of two binary states, respectively,
  (b) a second output signal indicative of a second of said eight data inputs when said three select inputs are at said one, said one, and the other of said two binary states, respectively,
  (c) a third output signal indicative of a third of said eight data inputs when said three select inputs are at said one, the other, and said one of said two binary states, respectively,
  (d) a fourth output signal indicative of a fourth of said eight data inputs when said three select inputs are at said one, said other, and said other of said two binary states, respectively,
  (e) a fifth output signal indicative of a fifth of said eight data inputs when said three select inputs are at the other, said one, and said one of said two binary states, respectively,
  (f) a sixth output signal indicative of a sixth of said eight data inputs when said three select inputs are at said other, said one, and said other of said two binary states, respectively,
  (g) a seventh output signal indicative of a seventh of said eight data inputs when said three select inputs are at said other, said other, and said one of said two binary states, respectively, and
  (h) an eighth output signal indicative of an eighth of said eight data inputs when said three select inputs are at said other, said other, and said other of said two binary states, respectively;
- majority gate means having three inputs and an output, said majority gate means providing a first output signal when signals of one binary state are applied to none or only one of said three inputs of said gate means, and providing a second output signal when signals of said last named one binary state are applied to two or three of said three inputs of said gate means;
- means for coupling said input variable A to said select input of said first 2:1 multiplexer means;
- means for coupling said input variable B to said select input of said second 2:1 multiplexer means;
- means for coupling said output of said first 2:1 multiplexer means to (a) a first of said three select inputs of said 8:1 multiplexer means, and (b) a first of said three inputs of said majority gate means;
- means for coupling said output of said second 2:1 multiplexer means to (a) a second of said three select inputs of said 8:1 multiplexer means, and (b) a second of said three inputs of said majority gate means;
- means for receiving a carry-in signal $C_{IN}$;
- means for coupling said carry-in signal $C_{IN}$ to (a) a third of said three select inputs of said 8:1 multiplexer means, and (b) a third of said three inputs of said majority gate means; wherein with a first set of appropriate control signals applied to said data inputs of the three named multiplexer means, said unit acts as an adder by providing a sum function and a carry-out function at said output of said 8:1 multiplexer means and said output of said majority gate means, respectively;

with a second set of appropriate control signals applied to said unit, said unit acts as a subtractor;

with a third set of appropriate control signals applied to said data inputs of the three named multiplexer means, said unit acts as an "and" gate by providing an output signal at said output of said 8:1 multiplexer means indicative of the logical relation (A·B);

with a fourth set of appropriate control signals applied to said data inputs of the three named multiplexer means, said unit acts as an "or" circuit by providing an output signal at said output of said 8:1 multiplexer means indicative of the logical relation (A+B);

with a fifth set of appropriate control signals applied to said data inputs of the three named multiplexer means, said unit acts as an "exclusive or" circuit by providing an output signal at said output of said 8:1 multiplexer means indicative of the logical relation $(A+B)\overline{(A \cdot B)}$; and with a sixth set of appropriate control signals applied to said data inputs of the three named multiplexer means, said unit acts as a "nor" circuit by providing an output signal at said output of said 8:1 multiplexer means indicative of the logical relation $\overline{(A+B)}$.

7. An arithmetic logic system for performing arithmetic and logical functions on two input binary variables of the form $A_0, A_1, \ldots A_n$ and $B_0, B_1, \ldots B_n$ comprising:
- (n+1) arithmetic logic units as recited in claim 6;
- means for coupling said input variable $A_0, A_1, \ldots A_n$ to the first, second, ... and (n+1)st arithmetic logic units, respectively;
- means for coupling said input variable $B_0, B_1, \ldots B_n$ to said first, second, ... (n+1)st arithmetic logic units, respectively;
- means for coupling said output of said majority gate means of said first arithmetic logic unit to said carry-in signal receiving means for said second arithmetic logic unit; and
- means for coupling said output of said majority gate means of said nth arithmetic logic unit to said carry-in signal receiving means for said (n+1)st arithmetic logic unit; wherein with said first set of appropriate control signals applied to each of said units, said system acts as an adder by providing a sum function at the respective outputs of said 8:1 multiplexer means, and by providing a carry-out function at the output of said $(n+1)$st logic unit majority gate means.

8. The system as recited in claim 7 wherein $n=7$.

9. A logical circuit comprising:

a first binary controlled switching circuit means having n select lines, $2^n$ data signal lines, and a single output line, said first means switching a signal on one of said $2^n$ data signal lines onto said output line dependent upon the binary state of signals applied to said n select lines;

a second binary controlled switching circuit means having p select lines, $2^p$ data signal lines, and a single output line, said second means switching a signal on one of said second means $2^p$ data signal lines onto said second means output line dependent upon the binary state of signals applied to said second means p select lines;

a third binary controlled switching circuit means having m select lines, $2^m$ data signal lines, and a single output line, said third means switching a signal on one of said third means $2^m$ data signal lines onto said third means output line dependent upon the binary state of signals applied to said third means m select lines;

means coupling said first means output line to one of said third means select lines; and means coupling said second means output line to a second of said third means select lines; wherein n, p and m are integers and $m \geq n+p$.

10. The circuit as recited in claim 9, wherein $n=1$; $p=1$; and $m=3$.

* * * * *